United States Patent
Liu et al.

(10) Patent No.: US 12,132,304 B2
(45) Date of Patent: Oct. 29, 2024

(54) OVER-ENERGY PROTECTION CIRCUIT, RESIDUAL CURRENT DEVICE, ELECTRONIC DEVICE, AND POWER DISTRIBUTION BOX

(71) Applicant: HUAWEI TECHNOLOGIES CO., LTD., Shenzhen (CN)

(72) Inventors: Qingying Liu, Shenzhen (CN); Kui Li, Tianjin (CN); Feng Niu, Tianjin (CN); Zijian Xu, Tianjin (CN); Chenyu Xie, Tianjin (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 246 days.

(21) Appl. No.: 17/858,253

(22) Filed: Jul. 6, 2022

(65) Prior Publication Data

US 2022/0337048 A1    Oct. 20, 2022

Related U.S. Application Data

(63) Continuation of application No. PCT/CN2021/070685, filed on Jan. 7, 2021.

(30) Foreign Application Priority Data

Jan. 7, 2020    (CN) .......................... 202010014653.0

(51) Int. Cl.
*H02H 3/10*    (2006.01)
*H02H 1/00*    (2006.01)

(52) U.S. Cl.
CPC ............ *H02H 3/10* (2013.01); *H02H 1/0007* (2013.01)

(58) Field of Classification Search
CPC .......... H02H 1/00; H02H 1/0007; H02H 1/04; H02H 7/12; H02H 7/122; H02H 7/48; H02H 7/06

(Continued)

(56) References Cited

U.S. PATENT DOCUMENTS 5,579,215 A * 11/1996 Turuta ................. H03K 17/105
                                                                363/57
9,350,265 B2 * 5/2016 Knill ....................... H02J 3/381
(Continued)

FOREIGN PATENT DOCUMENTS

CN        1319927 A      10/2001
CN      203377585 U       1/2014
(Continued)

OTHER PUBLICATIONS

Bai et al., "Design of Three-Phase Overvoltage and Undervoltage Miniature Circuit Breaker with Residual Current Protection", Low-voltage electrical appliances, Mar. 4, 2013, 3 pages (English Abstract included).

*Primary Examiner* — Tuan T Dinh
(74) *Attorney, Agent, or Firm* — Maier & Maier, PLLC

(57) ABSTRACT

An over-energy protection circuit, a residual current device, an electronic device, and a power distribution box. The protection circuit has relatively high operating reliability, and includes: a first over-energy absorption circuit, a second over-energy absorption circuit, and a residual current determining circuit. The first over-energy absorption circuit receives a first electrical signal output from a current transformer; and when a voltage value of the first electrical signal is greater than or equal to a first preset threshold, performs step-down processing on the first electrical signal to obtain a second electrical signal, and outputs the second electrical signal to the second over-energy absorption circuit; or when a voltage value of the first electrical signal is less than a first preset threshold, outputs the first electrical signal to the second over-energy absorption circuit.

15 Claims, 7 Drawing Sheets

(58) Field of Classification Search
USPC ...... 361/78–90, 91.1, 91.5–91.8; 363/55–58, 363/135–137
See application file for complete search history.

(56) References Cited

U.S. PATENT DOCUMENTS

| | | | | |
|---|---|---|---|---|
| 2006/0086981 | A1* | 4/2006 | Yamaguchi | H02M 7/003 |
| | | | | 257/347 |
| 2012/0026631 | A1* | 2/2012 | Kazemi | H02H 3/16 |
| | | | | 361/42 |
| 2013/0334884 | A1* | 12/2013 | Arisawa | H02M 7/06 |
| | | | | 307/151 |
| 2013/0342948 | A1* | 12/2013 | Jankowski | H02H 7/20 |
| | | | | 361/93.9 |
| 2019/0148097 | A1* | 5/2019 | Cheng | H01H 83/02 |
| | | | | 361/42 |
| 2019/0331734 | A1* | 10/2019 | Hanrahan | H02H 3/335 |

FOREIGN PATENT DOCUMENTS

| | | |
|---|---|---|
| CN | 205389098 U | 7/2016 |
| CN | 205489452 U | 8/2016 |
| CN | 205657418 U | 10/2016 |
| CN | 106711982 A | 5/2017 |
| CN | 206364492 U | 7/2017 |
| CN | 207251174 U | 4/2018 |
| CN | 109787203 A | 5/2019 |
| DE | 102018204047 A1 | 9/2019 |
| WO | 2011160550 A1 | 12/2011 |

* cited by examiner

OVER-ENERGY PROTECTION CIRCUIT, RESIDUAL CURRENT DEVICE, ELECTRONIC DEVICE, AND POWER DISTRIBUTION BOX

CROSS-REFERENCE TO RELATED APPLICATIONS

This application is a continuation of International Application No. PCT/CN2021/070685, filed on Jan. 7, 2021, which claims priority to Chinese Patent Application No. 202010014653.0, filed on Jan. 7, 2020. The disclosures of the aforementioned applications are hereby incorporated by reference in their entireties.

TECHNICAL FIELD

The embodiments relate to the field of power electronics technologies, an over-energy protection circuit, a residual current device, an electronic device, and a power distribution box.

BACKGROUND

In a power supply system or a power distribution system, a protection circuit configured to protect safety of a device in the system is usually disposed on a power supply path of the system, to ensure power supply safety or power distribution safety. A residual current device (RCD) is used as an example. The residual current device detects a residual current on the power supply path. When detecting that the residual current exceeds a specified value, the residual current device determines that an electric leakage phenomenon occurs in the system, and disconnects the power supply path, thereby implementing safety protection on a load and a system device.

In actual use of the device, when the system experiences a lightning strike, a short-term over-energy current is generated on the power supply path. When detecting the large current generated due to the lightning strike against the system, the device considers that the system encounters an electric leakage phenomenon and disconnects the main path. This affects normal running of the system.

Therefore, when an existing protection circuit receives over energy (that is, excessive energy), operation of a protection apparatus is affected, and a misjudgment phenomenon is caused, reducing operation reliability of the protection apparatus.

SUMMARY

The embodiments provide an over-energy protection circuit, a residual current device, an electronic device, and a power distribution box, to reduce impact of an over-energy interfering signal on a protection circuit and improve operating reliability of the protection circuit.

According to a first aspect, an embodiment provides an over-energy protection circuit. The protection circuit is applied to a residual current device. The residual current device includes the over-energy protection circuit, a current transformer, and a release. The over-energy protection circuit includes a first over-energy absorption circuit, a second over-energy absorption circuit, and a residual current determining circuit. The first over-energy absorption circuit is connected to a secondary side of the current transformer. The second over-energy absorption circuit is connected to an output end of the first over-energy absorption circuit. The residual current determining circuit is connected to an output end of the second over-energy absorption circuit and the release.

The first over-energy absorption circuit is configured to: receive a first electrical signal output from the secondary side of the current transformer; and when a voltage value of the first electrical signal is greater than or equal to a first preset threshold, perform step-down processing on the voltage value of the first electrical signal to obtain a second electrical signal, and output the second electrical signal to the second over-energy absorption circuit; or when a voltage value of the first electrical signal is less than a first preset threshold, output the first electrical signal to the second over-energy absorption circuit. The second over-energy absorption circuit is configured to: when an input current input to the second over-energy absorption circuit is greater than or equal to a second preset threshold, absorb energy of the input current; or when a current input to the second over-energy absorption circuit is less than a second preset threshold, output the input current to the residual current determining circuit. The residual current determining circuit is configured to: when the current flowing to the residual current control circuit meets a predetermined condition, control the release to be disconnected.

When the foregoing circuit is used to protect a system, and a short-term over-energy large current occurs on a power supply path due to a lightning strike against the system, because the current in the circuit is very large, the voltage value of the electrical signal output from the secondary side of the current transformer is much greater than a voltage generated upon a fault (for example, an electric leakage). A first part (a part whose voltage value of the electrical signal is greater than the first preset threshold) of over energy generated by experiencing the lightning strike may be consumed by the first over-energy absorption circuit. A second part of over energy of the lightning (a part obtained after the consumption by the first over-energy absorption circuit) is consumed by the second over-energy absorption circuit. In this case, energy output by the second over-energy absorption circuit is insufficient to control the release to operate, thereby improving operating reliability of the protection circuit.

The second over-energy absorption circuit may include: R1, R2, R3, R4, first diodes D1 and D2, a first PNP triode, and a first NPN triode. An anode of D1 is a first terminal of an input end of the second over-energy absorption circuit, a collector of the first PNP triode is a second terminal of the input end of the second over-energy absorption circuit, a first end of R2 is a first terminal of the output end of the second over-energy absorption circuit, and a second end of R4 is a second terminal of the output end of the second over-energy absorption circuit. The anode of D1 is connected to a first terminal of the output end of the first over-energy absorption circuit and a cathode of D2, and a cathode of D1 is connected to a first end of RE A second end of the first R1 is connected to the first end of R2 and an emitter of the first PNP triode. A second end of R2 is connected to a base of the first PNP triode. The collector of the first PNP triode is connected to a collector of the first NPN triode and a second terminal of the output end of the first over-energy absorption circuit. An anode of D2 is connected to a first end of R3. An emitter of the first NPN triode is connected to the first end of R3 and a first end of R4, and a base of the first NPN triode is connected to the second end of R4.

According to the foregoing circuit structure, when a current value of the signal output by the first over-energy absorption circuit is greater than or equal to the second preset threshold, it is determined that the signal has over energy. When the signal passes through the resistor R2 or R4, a voltage drop at both ends of R2 or R4 exceeds a turn-on voltage of the first PNP triode or the first NPN triode (a product of the second preset threshold and R2 is greater than or equal to the turn-on voltage of the first PNP triode, and a product of the second preset threshold and R4 is greater than or equal to the turn-on voltage of the first NPN triode). The first PNP triode or the first NPN triode is conducted. In this case, the signal output by the first over-energy absorption circuit passes through a path formed by the first PNP triode or the first NPN triode and is consumed, to reduce impact of over energy on the protection circuit.

The second over-energy absorption circuit may include: R5, R6, D3, D4, a first P-channel metal oxide semiconductor MOS transistor, and a first N-channel MOS transistor. An anode of D3 is a first terminal of an input end of the second over-energy absorption circuit, a drain of the first N-channel MOS transistor is a second terminal of the input end of the second over-energy absorption circuit, a second end of R5 is a first terminal of the output end of the second over-energy absorption circuit, and a second end of R6 is a second terminal of the output end of the second over-energy absorption circuit. The anode of D3 is connected to a first terminal of the output end of the first over-energy absorption circuit and a cathode of D4, and a cathode of D3 is connected to a first end of R5 and a source of the first N-channel MOS transistor. The second end of R5 is connected to a gate of the first N-channel MOS transistor. A drain of the first P-channel MOS transistor is connected to the drain of the first N-channel MOS transistor and a second terminal of the output end of the first over-energy absorption circuit, a source of the first P-channel MOS transistor is connected to a first end of R6, and a gate of the first P-channel MOS transistor is connected to the second end of R6. The first end of R6 is connected to an anode of D4.

According to the foregoing circuit, when the voltage value of the signal output by the first over-energy absorption circuit is greater than or equal to the second preset threshold, it is determined that the signal has over energy. When the signal passes through the resistor R5 or R6, a voltage drop generated at both ends of R5 or R6 exceeds a turn-on voltage of the first P-channel metal oxide semiconductor MOS transistor or the first N-channel MOS transistor (a product of the second preset threshold and R5 is greater than or equal to the turn-on voltage of the first N-channel MOS transistor, and a product of the second preset threshold and R6 is greater than or equal to the turn-on voltage of the first P-channel MOS transistor). The first P-channel metal oxide semiconductor MOS transistor or the first N-channel MOS transistor is conducted. In this case, the signal output by the first over-energy absorption circuit passes through the first P-channel metal oxide semiconductor MOS transistor or the first N-channel MOS transistor and is consumed, to reduce impact of over energy on the protection circuit.

The second over-energy absorption circuit may include: R7, R8, D5, D6, D7, D8, and a second PNP triode. An anode of D5 is a first terminal of an input end of the second over-energy absorption circuit, a cathode of D8 is a second terminal of the input end of the second over-energy absorption circuit, a second end of R8 is a first terminal of the output end of the second over-energy absorption circuit, and an anode of D8 is a second terminal of the output end of the second over-energy absorption circuit. The anode of D5 is connected to a first terminal of the output end of the first over-energy absorption circuit and a cathode of D6, and a cathode of D5 is connected to a cathode of D7 and a first end of R7. The cathode of D8 is connected to an anode of D7 and a second terminal of the output end of the first over-energy absorption circuit, and the anode of D8 is connected to an anode of D6 and a collector of the second PNP crystal triode. A second end of R7 is connected to an emitter of the second PNP triode and a first end of R8. The second end of R8 is connected to a base of the second PNP triode.

According to the foregoing circuit structure, when the voltage value of the signal output by the first over-energy absorption circuit is greater than or equal to the second preset threshold, it is determined that the signal has over energy. When the signal passes through the resistor R8, a voltage drop generated at both ends of R8 exceeds a turn-on voltage of the second PNP triode (a product of the second preset threshold and R8 is greater than or equal to the turn-on voltage of the second PNP triode). The second PNP triode is conducted. In this case, the signal output by the first over-energy absorption circuit passes through a path formed by the second PNP triode and is consumed, to reduce impact of over energy on the protection circuit.

The second over-energy absorption circuit may include: R9, R10, D9, D10, D11, D12, and a second NPN triode. An anode of D9 is a first terminal of an input end of the second over-energy absorption circuit, a cathode of D12 is a second terminal of the input end of the second over-energy absorption circuit, a cathode of D11 is a first terminal of the output end of the second over-energy absorption circuit, and a second end of R10 is a second terminal of the output end of the second over-energy absorption circuit. The anode of D9 is connected to a first terminal of the output end of the first over-energy absorption circuit and a cathode of D10, and a cathode of D9 is connected to the cathode of D11 and a collector of the second NPN triode. The cathode of D12 is connected to an anode of D11 and a second terminal of the output end of the first over-energy absorption circuit, and an anode of D12 is connected to an anode of D10 and a first end of R9. A second end of R9 is connected to a first end of R10 and an emitter of the second NPN triode. The second end of R10 is connected to a base of the second NPN triode.

According to the foregoing circuit structure, when the voltage value of the signal output by the first over-energy absorption circuit is greater than or equal to the second preset threshold, it is determined that the signal has over energy. When the signal passes through the resistor R10, a voltage drop generated at both ends of R10 exceeds a turn-on voltage of the second NPN triode (a product of the second preset threshold and R10 is greater than or equal to the turn-on voltage of the second NPN triode). The second NPN triode is conducted. In this case, the signal output by the first over-energy absorption circuit can pass through a path formed by the second NPN triode and be consumed, to reduce impact of over energy on the protection circuit.

The second over-energy absorption circuit may include: R11, D13, D14, D15, D16, and a second P-channel MOS transistor. An anode of D13 is a first terminal of an input end of the second over-energy absorption circuit, a cathode of D16 is a second terminal of the input end of the second over-energy absorption circuit, a cathode of D15 is a first terminal of the output end of the second over-energy absorption circuit, and a second end of R11 is a second terminal of the output end of the second over-energy absorption circuit. The anode of D13 is connected to a first terminal of the output end of the first over-energy absorption circuit and a cathode of D14, and a cathode of D13 is connected to a drain of the second P-channel MOS transistor. The cathode of D16 is connected to an anode of D15 and a second terminal of the output end of the first over-energy absorption circuit, and an anode of D16 is connected to an anode of D14 and a source of the second P-channel MOS transistor. The source of the second P-channel MOS transistor is connected to a first end of R11, and a gate of the second P-channel MOS transistor is connected to the second end of R11.

According to the foregoing circuit structure, when the voltage value of the signal output by the first over-energy absorption circuit is greater than or equal to the second preset threshold, it is determined that the signal has over energy. When the signal passes through the resistor R11, a voltage drop generated at both ends of R11 exceeds a turn-on voltage of the second P-channel MOS transistor (a product of the second preset threshold and R11 is greater than or equal to the turn-on voltage of the second P-channel MOS transistor). The second P-channel MOS transistor is conducted. In this case, the signal output by the first over-energy absorption circuit can pass through a path formed by the second P-channel MOS transistor and be consumed, to reduce impact of over energy on the protection circuit.

the second over-energy absorption circuit may include: R12, D17, D18, D19, D20, and a second N-channel MOS transistor. An anode of D17 is a first terminal of an input end of the second over-energy absorption circuit, a cathode of D20 is a second terminal of the input end of the second over-energy absorption circuit, a second end of R12 is a first terminal of the output end of the second over-energy absorption circuit, and an anode of D20 is a second terminal of the output end of the second over-energy absorption circuit. The anode of D17 is connected to a first terminal of the output end of the first over-energy absorption circuit and a cathode of D18, and a cathode of D17 is connected to a cathode of D19 and a source of the second N-channel MOS transistor. The cathode of D20 is connected to a second terminal of the output end of the first over-energy absorption circuit and an anode of D19, and the anode of D20 is separately connected to an anode of D18 and a drain of the second N-channel MOS transistor. The source of the second N-channel MOS transistor is connected to a first end of R12, and a gate of the second N-channel MOS transistor is connected to the second end of R12.

According to the foregoing circuit structure, when the voltage value of the signal output by the first over-energy absorption circuit is greater than or equal to the second preset threshold, it is determined that the signal has over energy. When the signal passes through the resistor R12, a voltage drop generated at both ends of R12 exceeds a turn-on voltage of the second N-channel MOS transistor (a product of the second preset threshold and R12 is greater than or equal to the turn-on voltage of the second N-channel MOS transistor). The second N-channel MOS transistor is conducted. In this case, the signal output by the first over-energy absorption circuit can pass through a path formed by the second N-channel MOS transistor and be consumed, to reduce impact of over energy on the protection circuit.

The first over-energy absorption circuit may include at least two transient suppression diodes, and the at least two transient suppression diodes are configured to: when the voltage value of the first electrical signal is greater than or equal to the first preset threshold, perform step-down processing on the voltage value of the first electrical signal to obtain the second electrical signal, and output the second electrical signal to the second over-energy absorption circuit; or when the voltage value of the first electrical signal is less than the first preset threshold, output the first electrical signal to the second over-energy absorption circuit.

According to the foregoing circuit structure, because a single-phase alternating current is transmitted on a branch to be detected, the first electrical signal output by a converter circuit is also a single-phase alternating current. When the first electrical signal has over energy, at least one transient suppression diode may be used to absorb a positive half-cycle signal of the first electrical signal, and at least one transient suppression diode may be used to absorb a negative half-cycle signal of the first electrical signal, to reduce impact of over energy on the protection circuit.

In addition, one bipolar transient suppression diode may be used to replace two unipolar transient suppression diodes to achieve a similar effect.

The protection circuit may further include a voltage regulator circuit. The voltage regulator circuit is connected between the secondary side of the current transformer and the first over-energy absorption circuit and is configured to regulate the voltage value and a current value of the first electrical signal.

The voltage regulator circuit may include: R13 and a first capacitor. A first end of R13 is connected to a first terminal of the secondary side of the current transformer, and a second end of R13 is connected to a second terminal of the secondary side of the current transformer. A first end of the first capacitor is connected to the first end of R13, and a second end of the first capacitor is connected to the second end of R13.

According to the foregoing circuit structure, the voltage regulator circuit may be used to reduce a fluctuation of the value of the first electrical signal output from the secondary side of the current transformer, to reduce impact of the fluctuation of the first electrical signal on a detection structure.

The residual current determining circuit may include a detector and a drive circuit. The detector is connected to the output end of the second over-energy absorption circuit, and the drive circuit is connected to the detector.

The detector is configured to: when a value of the current flowing to the residual current control circuit is greater than or equal to a third preset threshold, send a drive signal to the drive circuit. The drive circuit is configured to: when receiving the drive signal, amplify power of the drive signal to generate a control signal, and send the control signal to the release, so as to control the release to be disconnected.

According to the foregoing circuit structure, the residual current determining circuit determines, by detecting the current value of the signal output by the second over-energy absorption circuit, whether to protect the system. When the circuit has over energy, the over energy is absorbed before the signal enters the residual current determining circuit. In this way, before the signal reaches the residual current determining circuit, the first over-energy absorption circuit and the second over-energy absorption circuit have suppressed the over energy into a normal voltage value. Therefore, the residual current determining circuit determines to protect the system only when a current leakage occurs (in this case, the voltage value of the signal output from the secondary side of the current transformer is less than the first preset threshold, and the current thereof is less than the second preset threshold and greater than or equal to the third threshold).

The drive circuit may include: R14, R15, R16, R17, D21, a second capacitor, and a third NPN triode. A first end of R14 is connected to an anode of D21 and a first output terminal of the detector, and a second end of R14 is connected to a second output terminal of the detector and a second end of R15. A cathode of D21 is connected to the second end of R15 and a second end of R16. The second end of R16 is connected to a first end of the second capacitor and a first end of R17. An emitter of the third NPN triode is connected to a coil of the release, a base of the third NPN triode is connected to a second end of R17, and the emitter of the third NPN triode is connected to a second end of the second capacitor.

According to the foregoing circuit structure, because a control signal output by the detector has relatively small power, the control signal cannot directly control the release to act, and the drive circuit may be disposed to perform amplification processing on the drive signal, so as to control the release to act.

The detector may include a comparator and a third capacitor. A first end of the third capacitor is connected to the first terminal of the output end of the second over-energy absorption circuit, and a second end of the third capacitor is connected to the second terminal of the output end of the second over-energy absorption circuit. A first input end of the comparator is connected to the first end of the third capacitor, a second input end of the comparator is connected to a reference power supply, and an output end of the comparator is connected to the drive circuit.

According to the foregoing circuit structure, when the signal output by the second over-energy absorption circuit is greater than the third preset threshold, the current charges the third capacitor, a voltage at both ends of the third capacitor is greater than an action voltage value of the comparator, and the comparator outputs the drive signal to drive the release to act.

According to a second aspect, an embodiment may provide an electronic device. The electronic device includes the over-energy protection circuit according to the first aspect. The electronic device further includes a processor and a memory. The processor is configured to read code stored in the memory to perform data processing. In another possible implementation of the second aspect, the electronic device further includes a current transformer and a release. The current transformer, the release, and the over-energy protection circuit form a residual current device.

According to a third aspect, an embodiment may provide a power distribution box, including the over-energy protection circuit according to the first aspect. In the third aspect, the power distribution box may further include a current transformer and a release. The current transformer, the release, and the over-energy protection circuit form a residual current device.

According to a fourth aspect, an embodiment may provide a residual current device, including a current transformer, a release, and the over-energy protection circuit according to the first aspect.

DETAILED DESCRIPTION OF THE EMBODIMENTS

The following further describes in detail the embodiments with reference to the accompanying drawings.

An over-energy protection circuit provided in an embodiment may be applied to a power supply system or a power distribution system (such as an ACDU power distribution box). The over-energy protection circuit is configured to detect whether a fault (such as an electric leakage fault) occurs in the system, and when it is determined that a fault occurs in the system, disconnect a system path, to implement safety protection on a load and a system device. In addition, the protection circuit provided in this embodiment can prevent impact of an interfering signal on the protection circuit.

Figure 1:
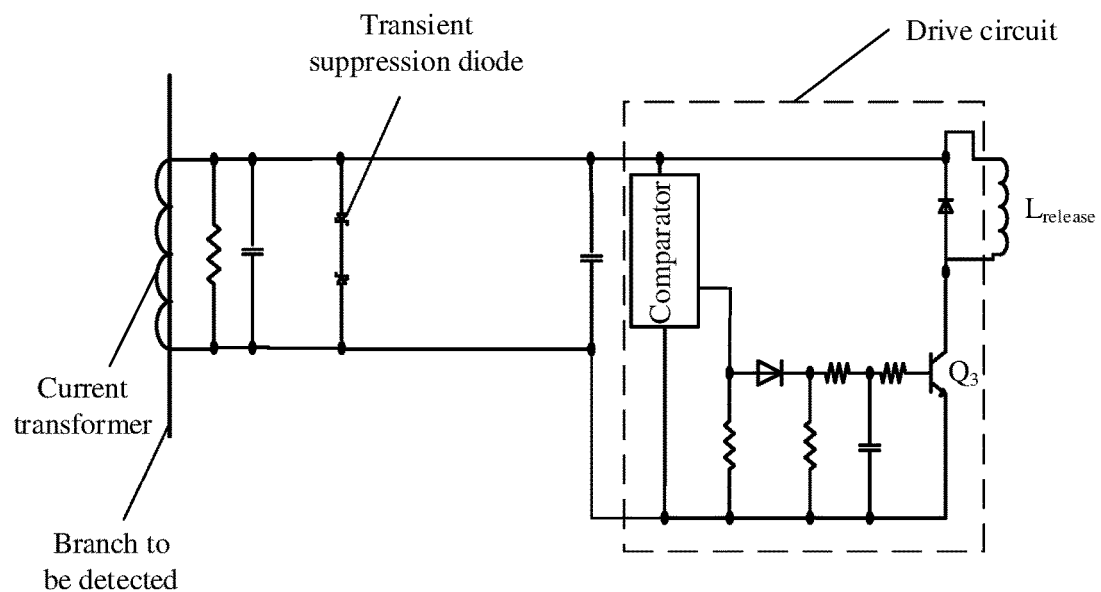
FIG. 1 is a schematic diagram of a structure of an existing RCD protection circuit according to an embodiment.

Referring to FIG. 1, an RCD protection circuit is used as an example. FIG. 1 shows a possible structure of the RCD protection circuit. As shown in FIG. 1, the RCD protection circuit includes a current transformer, a transient suppression diode, and a drive circuit. The current transformer detects a current on a power supply path in real time and outputs the detected current to the transient suppression diode after conversion. When the system experiences a lightning strike, the current on the power supply path increases abruptly, causing an abrupt increase to a voltage value of a signal output by the current transformer. When the voltage value of the signal output by the current transformer is greater than a specified value, it is determined that over energy occurs at this time. The transient suppression diode operates to consume the energy and converts a voltage output by the current transformer into a normal value. At this time, the voltage value of the converted signal is insufficient to drive the drive circuit to operate. The power supply path is properly connected for operation. Over energy may refer to excessive energy, including, but not limited to, energy corresponding to overvoltage (for example, energy formed by a surge voltage or an impulse voltage) and energy corresponding to overcurrent (for example, energy formed by a surge current or an inrush current).

Although the RCD protection circuit shown in FIG. 1 can implement safety protection on a load and a system device, in a protection process, if the system experiences a lightning strike, a relatively large over-energy current occurs in a power supply line. Because a process is required to consume lightning energy (the over energy), in the process of consuming the lightning energy, a current generated by the lightning energy on a system path gradually decreases, and the voltage value of the voltage output by the current transformer may be less than a turn-on voltage of the transient suppression diode. In this case, when detecting the voltage, the RCD protection circuit considers by default that an electric leakage phenomenon occurs in the system, and controls, by using the release, the power supply path to be disconnected. This affects normal operation of the system.

Therefore, a protection circuit in a conventional technology is prone to impact of over energy, and operating reliability is low.

To make the objectives, solutions, and advantages clearer, the following further describes the embodiments in detail with reference to the accompanying drawings.

The embodiments may provide an over-energy protection circuit, a residual current device, an electronic device, and a power distribution box, to reduce impact of over energy on a protection circuit and improve operating reliability of the protection circuit.

It should be noted that "a plurality of" means two or more than two.

A connection describes a connection relationship between two objects and may represent two connection relationships. For example, a connection between A and B may represent two cases: A is directly connected to B, and A is connected to B through C.

In addition, it should be understood that, in the embodiments, terms such as "first" and "second" are merely used for differentiation and description but cannot be understood as an indication or implication of relative importance or an indication or implication of an order.

Figure 2:
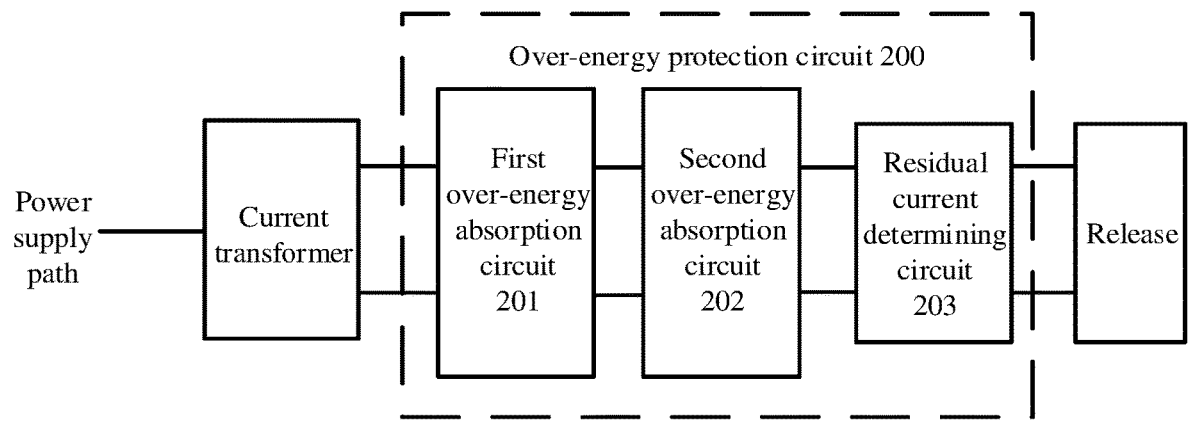
FIG. 2 is a schematic diagram of a structure of an over-energy protection circuit according to an embodiment.

FIG. 2 is a schematic diagram of a structure of an over-energy protection circuit according to an embodiment. The protection circuit 200 is used in an RCD, and the RCD includes the over-energy protection circuit, a current transformer, and a release. As shown in FIG. 2, the protection circuit 200 includes a first over-energy absorption circuit 201, a second over-energy absorption circuit 202, and a residual current determining circuit 203. The first over-energy absorption circuit 201 is connected to a secondary side of the current transformer. The second over-energy absorption circuit 202 is connected to an output end of the first over-energy absorption circuit 201. The residual current determining circuit 203 is connected to an output end of the second over-energy absorption circuit 202 and the release.

The first over-energy absorption circuit 201 is configured to: receive a first electrical signal output from the secondary side of the current transformer; and when a voltage value of the first electrical signal is greater than or equal to a first preset threshold, perform step-down processing on the voltage value of the first electrical signal to obtain a second electrical signal, and output the second electrical signal to the second over-energy absorption circuit; or when a voltage value of the first electrical signal is less than a first preset threshold, output the first electrical signal to the second over-energy absorption circuit 202. The second over-energy absorption circuit 202 is configured to: when an input current input to the second over-energy absorption circuit 202 is greater than or equal to a second preset threshold, absorb energy of the input current; or when a current input to the second over-energy absorption circuit 202 is less than a second preset threshold, output the input current to the residual current determining circuit 203. The residual current determining circuit 203 is configured to: when the current flowing to the residual current determining circuit 203 meets a predetermined condition, control the release to be disconnected.

When the system is protected by using the over-energy protection circuit 200, if the system experiences a lightning strike, although lightning energy (over energy) can be consumed by using a lightning arrester, a corresponding process is required to consume the lightning energy. In the process of consuming the lightning energy, a gradually decreasing large over-energy current is generated on a power supply path. At an initial over-energy stage, a current on the power supply path is relatively large. In this case, a voltage value of the first electrical signal that is received by the first over-energy absorption circuit 201 and that is output from the secondary side of the current transformer is relatively large (greater than or equal to the first preset threshold). The first over-energy absorption circuit 201 absorbs this part of energy (a part, in the over energy, whose voltage value is greater than or equal to the first preset threshold), that is, performs step-down processing (absorption) on the voltage value of the first electrical signal, and outputs the second electrical signal. At a later over-energy stage, a voltage value of the signal that is received by the first over-energy absorption circuit 201 and that is output from the secondary side of the current transformer decreases (becomes less than the first preset threshold). The first over-energy absorption circuit 201 does not operate (the voltage value of the first signal is less than the first preset threshold), but directly outputs the signal to the second over-energy absorption circuit 202. However, a current value of the signal is still relatively large and greater than the second preset threshold. The second over-energy absorption circuit 202 may absorb residual energy of the over energy. In this case, a value of the current output to the residual current determining circuit decreases. The release does not act, and the system operates normally. When a fault (such as an electric leakage fault) occurs in the system, the current transformer converts a fault current on the power supply path into a first electrical signal, and outputs the first electrical signal to the first over-energy absorption circuit 201. Because the current occurring on the power supply path is relatively small when the fault occurs on the power supply path, a voltage value of the first electrical signal is less than the first preset threshold, and a current value thereof is less than the second preset threshold and greater than the third threshold. In this case, the voltage signal may be directly output to the residual current determining circuit 203. The residual current determining circuit 203 controls the release to act, so as to disconnect the power supply path, thereby implementing safety protection on a load and a system device. It can be understood from the above that, the over-energy protection circuit 200 provided in this embodiment not only can implement safety protection on the system, but also can reduce impact of the over energy on the protection circuit 200, thereby improving operating reliability of the protection circuit 200.

It should be understood that, if no lightning arrester is configured in the system, lightning energy may be consumed by using the over-energy protection circuit 200 provided in this embodiment, so as to avoid device damage caused by lightning energy that cannot be consumed.

The following describes structures of the first over-energy absorption circuit 201, the second over-energy absorption circuit 202, and the residual current determining circuit 203 in the over-energy protection circuit 200.

1. First Over-Energy Absorption Circuit 201

The first over-energy absorption circuit 201 includes at least two transient suppression diodes. A function of disposing the transient suppression diodes is to: when the voltage value of the first electrical signal (a single-phase alternating current) output from the secondary side of the current transformer is greater than or equal to the first preset threshold (an operating voltage of the transient suppression diode), absorb a positive half-cycle signal of the first electrical signal by using at least one transient suppression diode, and suppress a negative half-cycle signal of the first electrical signal by using at least one second transient suppression diode. When the voltage value of the first voltage signal is less than the first preset threshold, neither/none of the transient suppression diodes operates.

The first over-energy absorption circuit 201 may be connected in parallel to the secondary side of the current transformer. For example, the first over-energy absorption circuit 201 includes two transient suppression diodes (a first transient suppression diode and a second transient suppression diode). An anode of the first transient suppression diode is a first terminal of the first over-energy absorption circuit 201, and an anode of the second transient suppression diode is a second terminal of the first over-energy absorption circuit 201. The anode of the first transient suppression diode is connected to a first terminal of the secondary side of the current transformer, a cathode of the first transient suppression diode is connected to a cathode of the second transient suppression diode, and the anode of the second transient suppression diode is connected to a second terminal of the secondary side of the current transformer.

When lightning energy exists in the power supply path due to a lightning strike against the system, and when a voltage value of the first electrical signal output by the current transformer by converting the lightning energy is greater than the first preset threshold (a turn-on voltage of the transient suppression diode), the transient suppression diode operates to absorb the energy. In this way, determining of the residual current determining circuit 203 in the protection circuit 200 is not affected.

In a possible implementation, to reduce a fluctuation of the first electrical signal, a voltage regulator circuit is further included between the secondary side of the current transformer and the first over-energy absorption circuit 201. The voltage regulator circuit includes: R13 and a first capacitor. A first end of R13 is connected to the first terminal of the secondary side of the current transformer, and a second end of R13 is connected to the second terminal of the secondary side of the current transformer. A first end of the first capacitor is connected to the first end of R13, and a second end of the first capacitor is connected to the second end of R13.

2. Second Over-Energy Absorption Circuit 202

The second over-energy absorption circuit 202 provided in this embodiment may be classified into six circuit structures based on different devices used to absorb over energy and different connection manners of the devices. The following describes the circuit structures of the second over-energy absorption circuit 202 with reference to embodiments. Details are as follows.

Embodiment 1: The second over-energy absorption circuit 202 includes: R1, R2, R3, R4, first diodes D1 and D2, a first PNP triode, and a first NPN triode.

An anode of D1 is a first terminal of an input end of the second over-energy absorption circuit 202, a collector of the first PNP triode is a second terminal of the input end of the second over-energy absorption circuit 202, a first end of R2 is a first terminal of the output end of the second over-energy absorption circuit 202, and a second end of R4 is a second terminal of the output end of the second over-energy absorption circuit 202. The anode of D1 is connected to a first terminal of the output end of the first over-energy absorption circuit 201 and a cathode of D2, and a cathode of D1 is connected to a first end of R5. A second end of the first R1 is connected to the first end of R2 and an emitter of the first PNP triode. A second end of R2 is connected to a base of the first PNP triode. The collector of the first PNP triode is connected to a collector of the first NPN triode and a second terminal of the output end of the first over-energy absorption circuit 201. An anode of D2 is connected to a first end of R3. An emitter of the first NPN triode is connected to the first end of R3 and a first end of R4, and a base of the first NPN triode is connected to the second end of R4.

For ease of understanding, the following provides an example of the second over-energy absorption circuit 202 provided in Embodiment 1.

Figure 3:
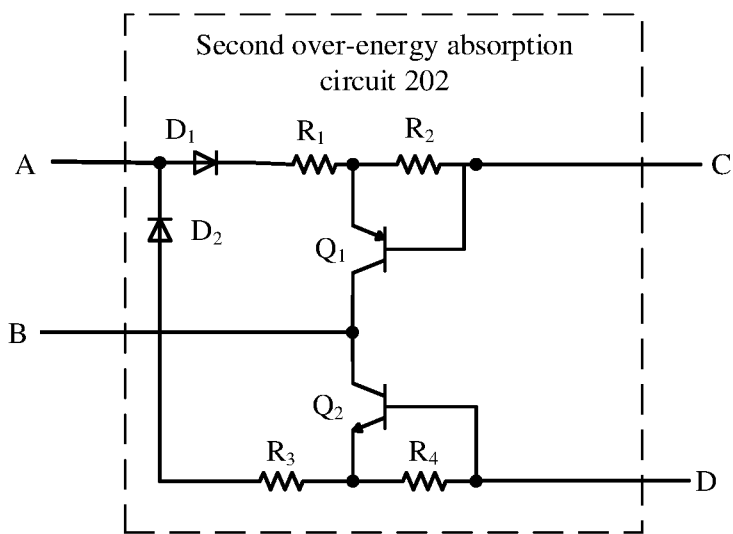
FIG. 3 is schematic diagram 1 of a structure of a second over-energy absorption circuit according to an embodiment.

FIG. 3 is a schematic diagram of a structure of the second over-energy absorption circuit 202 according to Embodiment 1. The circuit shown in FIG. 3 includes the resistors R1, R2, R3, and R4, the diodes D1 and D2, the first PNP triode (Q1), and the first NPN triode (Q2). A and B serve as input ends of the second over-energy absorption circuit 202 and are respectively connected to the first terminal and the second terminal of the first over-energy absorption circuit 201. C and D serve as output ends of the second over-energy absorption circuit 202 and are connected to the residual current determining circuit 203.

When the second over-energy absorption circuit 202 shown in FIG. 3 absorbs over energy, A and B serve as single-phase alternating current input ends to receive a single-phase alternating current voltage output from the secondary side of the current transformer, and C and D serve as single-phase direct current output ends to output the signal to the residual current determining circuit 203. The energy is transmitted from left to right.

When a major part (a part whose voltage value is greater than or equal to the first preset threshold at the initial over-energy stage) of the over energy is absorbed by the first over-energy absorption circuit 201, for the residual energy (a part whose voltage value is less than the first preset threshold) of the over energy, if a value of a current output after the residual energy passes through the first over-energy absorption circuit 201 is greater than or equal to the second preset threshold, using a positive half cycle of the signal as an example, when the signal passes through the resistor R2, a voltage drop generated at both ends of the resistor R2 is greater than a turn-on voltage of Q1 (that is, a product of the second preset threshold and the resistor R2 is greater than or equal to the turn-on voltage of Q1). Q1 is conducted. In this case, most of the residual energy is absorbed through a path formed by Q1 and R1, and a current output to the residual current determining circuit 203 is almost zero. Therefore, the release does not act. A negative half cycle of the signal is similar. In case of existence of residual energy, a voltage drop generated at both ends of the resistor R4 when the signal passes through the resistor R4 is greater than a turn-on voltage of Q2 (that is, a product of the second preset threshold and the resistor R4 is greater than or equal to the turn-on voltage of Q2). Q2 is conducted. In this case, most of the residual energy is consumed through a path formed by Q2 and R3, and a current output to the residual current determining circuit 203 is almost zero. Therefore, the release does not act, thereby reducing impact of the over energy on the protection circuit 200.

Embodiment 2: The second over-energy absorption circuit 202 includes: R5, R6, D3, D4, a first P-channel metal oxide semiconductor MOS transistor, and a first N-channel MOS transistor.

An anode of D3 is a first terminal of an input end of the second over-energy absorption circuit 202, a drain of the first N-channel MOS transistor is a second terminal of the input end of the second over-energy absorption circuit 202, a second end of R5 is a first terminal of the output end of the second over-energy absorption circuit 202, and a second end of R6 is a second terminal of the output end of the second over-energy absorption circuit 202. The anode of D3 is connected to a first terminal of the output end of the first over-energy absorption circuit 201 and a cathode of D4, and a cathode of D3 is connected to a first end of R5 and a source of the first N-channel MOS transistor. The second end of R5 is connected to a gate of the first N-channel MOS transistor. A drain of the first P-channel MOS transistor is connected to the drain of the first N-channel MOS transistor and a second terminal of the output end of the first over-energy absorption circuit 201, a source of the first P-channel MOS transistor is connected to a first end of R6, and a gate of the first P-channel MOS transistor is connected to the second end of R6. The first end of R6 is connected to an anode of D4.

For ease of understanding, the following provides an example of the second over-energy absorption circuit 202 provided in Embodiment 2.

Figure 4:
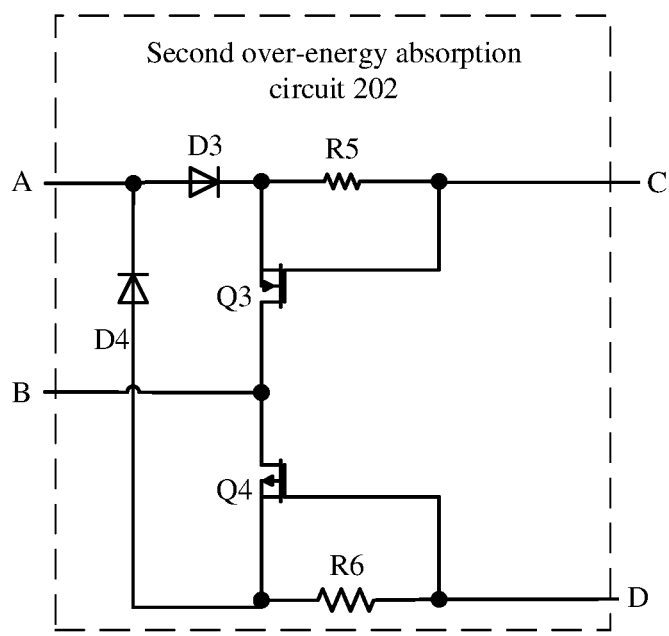
FIG. 4 is schematic diagram 2 of a structure of a second over-energy absorption circuit according to an embodiment.

FIG. 4 is a schematic diagram of a structure of the second over-energy absorption circuit 202 according to Embodiment 2. The circuit shown in FIG. 4 includes the resistors R5 and R6, D3, D4, the first P-channel MOS transistor (Q3), and the first N-channel MOS transistor (Q4). A and B serve as input ends of the second over-energy absorption circuit 202 and are respectively connected to the first terminal and the second terminal of the first over-energy absorption circuit 201. C and D serve as output ends of the second over-energy absorption circuit 202 and are connected to the residual current determining circuit 203.

When the second over-energy absorption circuit 202 shown in FIG. 4 absorbs over energy, A and B serve as single-phase alternating current input ends to receive a single-phase alternating current voltage output by the first over-energy absorption circuit 201, and C and D serve as single-phase direct current output ends to output the signal to the residual current determining circuit 203. The energy is transmitted from left to right.

When a major part (a part whose voltage value is greater than or equal to the first preset threshold at the initial over-energy stage) of the over energy is absorbed by the first over-energy absorption circuit 201, for the residual energy (a voltage value is less than the first preset threshold) of the over energy, if a value of a current output after the residual energy passes through the first over-energy absorption circuit 201 is greater than or equal to the second preset threshold, using a positive half cycle of the signal as an example, when the signal passes through the resistor R5, a voltage drop generated at both ends of the resistor R5 is greater than a turn-on voltage of Q3 (that is, a product of the second preset threshold and the resistor R5 is greater than or equal to the turn-on voltage of Q3). Q3 is conducted. In this case, most of the residual energy is consumed through a path formed by Q3 and D3, and a current output to the residual current determining circuit 203 is almost zero. Therefore, the release does not act. A negative half cycle of the signal is similar. When the current value of the signal is greater than or equal to the second preset threshold, a voltage drop generated at both ends of the resistor R6 when the signal passes through the resistor R6 is greater than a turn-on voltage of Q4 (that is, a product of the second preset threshold and the resistor R6 is greater than or equal to the turn-on voltage of Q4). Q4 is conducted. In this case, most of the residual energy is absorbed through a path formed by Q4 and D4, and a current output to the residual current determining circuit 203 is almost zero. Therefore, the release does not act, thereby reducing impact of the over energy on the protection circuit.

Embodiment 3: The second over-energy absorption circuit 202 includes: R7, R8, D5, D6, D7, D8, and a second PNP triode.

An anode of D5 is a first terminal of an input end of the second over-energy absorption circuit 202, a cathode of D8 is a second terminal of the input end of the second over-energy absorption circuit 202, a second end of R8 is a first terminal of the output end of the second over-energy absorption circuit 202, and an anode of D8 is a second terminal of the output end of the second over-energy absorption circuit 202. The anode of D5 is connected to a first terminal of the output end of the first over-energy absorption circuit 201 and a cathode of D6, and a cathode of D5 is connected to a cathode of D7 and a first end of R7. The cathode of D8 is connected to an anode of D7 and a second terminal of the output end of the first over-energy absorption circuit 201, and the anode of D8 is connected to an anode of D6 and a collector of the second PNP crystal triode. A second end of R7 is connected to an emitter of the second PNP triode and a first end of R8. The second end of R8 is connected to a base of the second PNP triode.

For ease of understanding, the following provides an example of the second over-energy absorption circuit 202 provided in Embodiment 3.

Figure 5:
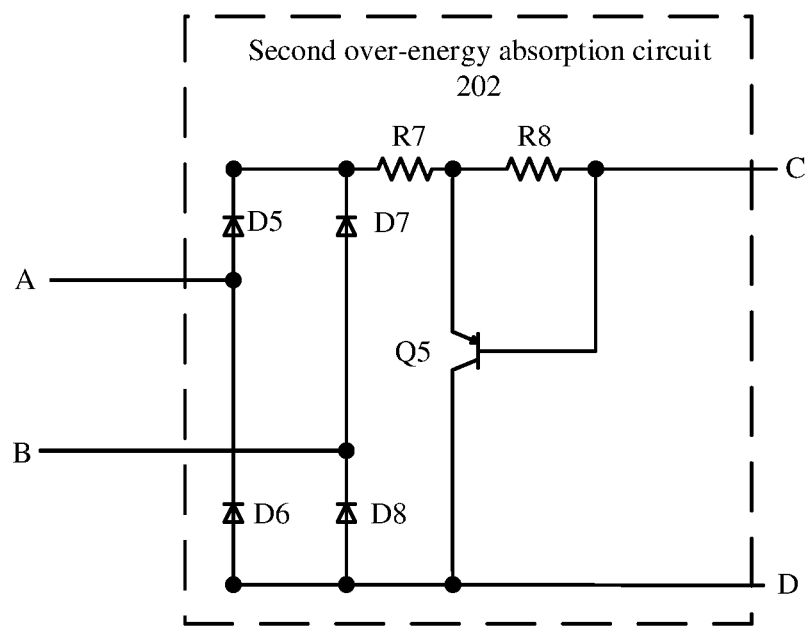
FIG. 5 is schematic diagram 3 of a structure of a second over-energy absorption circuit according to an embodiment.

FIG. 5 is a schematic diagram of a structure of the second over-energy absorption circuit 202 according to Embodiment 3. The circuit shown in FIG. 5 includes the resistors R7 and R8, D5, D6, D7, D8, and the second PNP triode (Q5). A and B serve as input ends of the second over-energy absorption circuit 202 and are respectively connected to the first terminal and the second terminal of the first over-energy absorption circuit 201. C and D serve as output ends of the second over-energy absorption circuit 202 and are connected to the residual current determining circuit 203.

When the second over-energy absorption circuit 202 shown in FIG. 5 absorbs over energy, A and B serve as single-phase alternating current input ends to receive a single-phase alternating current voltage output by the first over-energy absorption circuit 201, and C and D serve as single-phase direct current output ends to output the signal to the residual current determining circuit 203. The energy is transmitted from left to right.

when a major part (a part whose voltage value is greater than or equal to the first preset threshold at the initial over-energy stage) of the over energy is absorbed by the first over-energy absorption circuit 201, for the residual energy (a voltage value is less than the first preset threshold) of the over energy, if a value of a current output after the residual energy passes through the first over-energy absorption circuit 201 is greater than or equal to the second preset threshold, when the signal passes through the resistor R8, a voltage drop generated at both ends of the resistor R8 is greater than a turn-on voltage of Q5 (that is, a product of the second preset threshold and the resistor R8 is greater than or equal to the turn-on voltage of Q5). Q5 is conducted. In this case, most of the residual energy is absorbed through a path formed by Q5 and R7, and a current output to the residual current determining circuit 203 is almost zero. Therefore, the release does not act, thereby reducing impact of the over energy on the protection circuit.

Embodiment 4: The second over-energy absorption circuit 202 includes: R9, R10, D9, D10, D11, D12, and a second NPN triode.

An anode of D9 is a first terminal of an input end of the second over-energy absorption circuit 202, a cathode of D12 is a second terminal of the input end of the second over-energy absorption circuit 202, a cathode of D11 is a first terminal of the output end of the second over-energy absorption circuit 202, and a second end of R10 is a second terminal of the output end of the second over-energy absorption circuit 202. The anode of D9 is connected to a first terminal of the output end of the first over-energy absorption circuit 201 and a cathode of D10, and a cathode of D9 is connected to the cathode of D11 and a collector of the second NPN triode. The cathode of D12 is connected to an anode of D11 and a second terminal of the output end of the first over-energy absorption circuit 201, and an anode of D12 is connected to an anode of D10 and a first end of R9. A second end of R9 is connected to a first end of R10 and an emitter of the second NPN triode. The second end of R10 is connected to a base of the second NPN triode.

For ease of understanding, the following provides an example of the second over-energy absorption circuit 202 provided in Embodiment 4.

Figure 6:
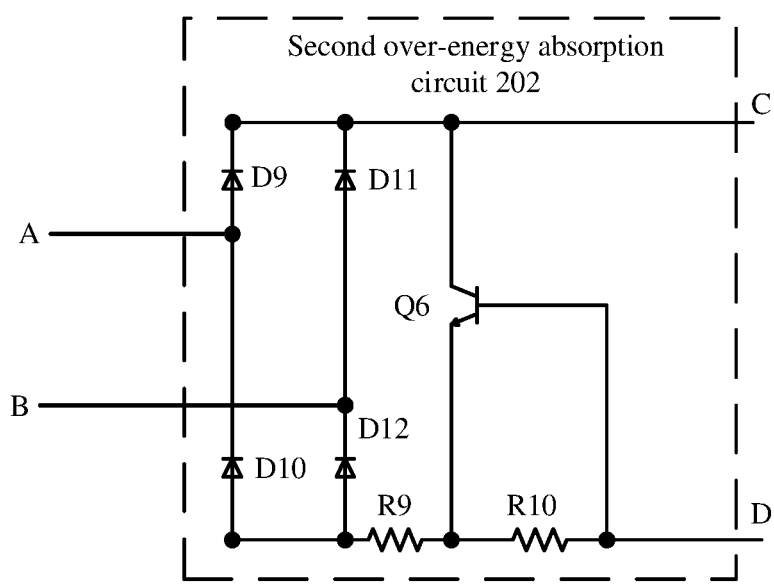
FIG. 6 is schematic diagram 4 of a structure of a second over-energy absorption circuit according to an embodiment.

FIG. 6 is a schematic diagram of a structure of the second over-energy absorption circuit 202 according to Embodiment 4. The circuit shown in FIG. 6 includes the resistors R9 and R10, the diodes D9, D10, D11, and D12, and the second NPN triode (Q6). A and B serve as input ends of the second over-energy absorption circuit 202 and are respectively connected to the first terminal and the second terminal of the first over-energy absorption circuit 201. C and D serve as output ends of the second over-energy absorption circuit 202 and are connected to the residual current determining circuit 203.

When the second over-energy absorption circuit 202 shown in FIG. 6 absorbs over energy, A and B serve as single-phase alternating current input ends to receive a single-phase alternating current voltage output by the first over-energy absorption circuit 201, and C and D serve as single-phase direct current output ends to output the signal to the residual current determining circuit 203. The energy is transmitted from left to right.

When a major part (a part whose voltage value is greater than or equal to the first preset threshold at the initial over-energy stage) of the over energy is absorbed by the first over-energy absorption circuit 201, for the residual energy (a voltage value is less than the first preset threshold) of the over energy, if a value of a current output after the residual energy passes through the first over-energy absorption circuit 201 is greater than or equal to the second preset threshold, when the signal passes through the resistor R10, a voltage drop generated at both ends of the resistor R10 is greater than a turn-on voltage of Q6 (that is, a product of the second preset threshold and the resistor R10 is greater than or equal to the turn-on voltage of Q6). Q6 is conducted. In this case, most of the residual energy is consumed through a path formed by Q6 and R9, and a current output to the residual current determining circuit 203 is almost zero. Therefore, the release does not act, thereby reducing impact of the over energy on the protection circuit.

Embodiment 5: The second over-energy absorption circuit 202 includes: R11, D13, D14, D15, D16, and a second P-channel MOS transistor.

An anode of D13 is a first terminal of an input end of the second over-energy absorption circuit 202, a cathode of D16 is a second terminal of the input end of the second over-energy absorption circuit 202, a cathode of D15 is a first terminal of the output end of the second over-energy absorption circuit 202, and a second end of R11 is a second terminal of the output end of the second over-energy absorption circuit 202. The anode of D13 is connected to a first terminal of the output end of the first over-energy absorption circuit 201 and a cathode of D14, and a cathode of D13 is connected to a drain of the second P-channel MOS transistor. The cathode of D16 is connected to an anode of D15 and a second terminal of the output end of the first over-energy absorption circuit 201, and an anode of D16 is connected to an anode of D14 and a source of the second P-channel MOS transistor. The source of the second P-channel MOS transistor is connected to a first end of R11, and a gate of the second P-channel MOS transistor is connected to the second end of R11.

For ease of understanding, the following provides an example of the second over-energy absorption circuit 202 provided in Embodiment 5.

Figure 7:
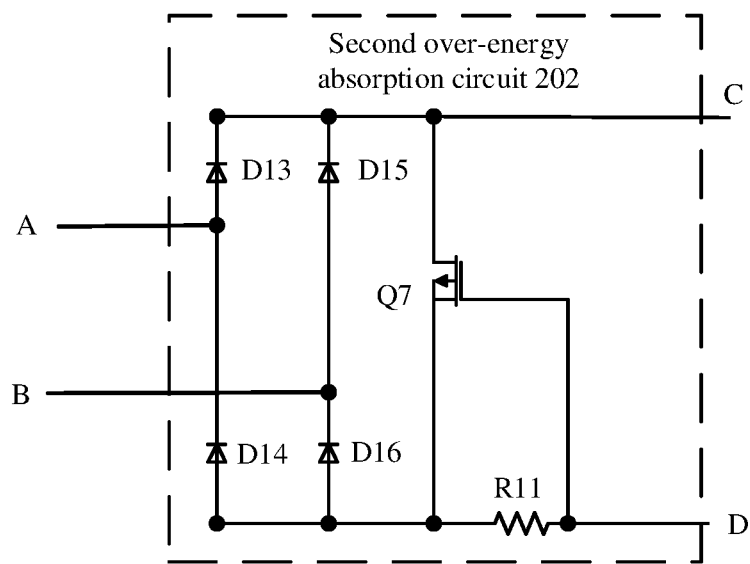
FIG. 7 is schematic diagram 5 of a structure of a second over-energy absorption circuit according to an embodiment.

FIG. 7 is a schematic diagram of a structure of the second over-energy absorption circuit 202 according to Embodiment 5. The circuit shown in FIG. 7 includes R11, the diodes D13, D14, D15, and D16, and the second P-channel MOS transistor (Q7). A and B serve as input ends of the second over-energy absorption circuit 202 and are respectively connected to the first terminal and the second terminal of the first over-energy absorption circuit 201. C and D serve as output ends of the second over-energy absorption circuit 202 and are connected to the residual current determining circuit 203.

When the second over-energy absorption circuit 202 shown in FIG. 7 absorbs over energy, A and B serve as single-phase alternating current input ends to receive a single-phase alternating current voltage output by the first over-energy absorption circuit 201, and C and D serve as single-phase direct current output ends to output the signal to the residual current determining circuit 203. The energy is transmitted from left to right.

When a major part (a part whose voltage value is greater than or equal to the first preset threshold at the initial over-energy stage) of the over energy is absorbed by the first over-energy absorption circuit 201, for the residual energy (a voltage value is less than the first preset threshold) of the over energy, if a value of a current output after the residual energy passes through the first over-energy absorption circuit 201 is greater than or equal to the second preset threshold, when the signal passes through the resistor R11, a voltage drop generated at both ends of the resistor R11 is greater than a turn-on voltage of Q7 (that is, a product of the second preset threshold and the resistor R11 is greater than or equal to the turn-on voltage of Q7). Q7 is conducted. In this case, most of the residual energy is absorbed through a path formed by Q7, and a current output to the residual current determining circuit 203 is almost zero. Therefore, the release does not act, thereby reducing impact of the over energy on the protection circuit.

Embodiment 6: The second over-energy absorption circuit 202 includes: R12, D17, D18, D19, D20, and a second N-channel MOS transistor.

An anode of D17 is a first terminal of an input end of the second over-energy absorption circuit 202, a cathode of D20 is a second terminal of the input end of the second over-energy absorption circuit 202, a second end of R12 is a first terminal of the output end of the second over-energy absorption circuit 202, and an anode of D20 is a second terminal of the output end of the second over-energy absorption circuit 202. The anode of D17 is connected to a first terminal of the output end of the first over-energy absorption circuit 201 and a cathode of D18, and a cathode of D17 is connected to a cathode of D19 and a source of the second N-channel MOS transistor. The cathode of D20 is connected to a second terminal of the output end of the first over-energy absorption circuit 201 and an anode of D19, and the anode of D20 is separately connected to an anode of D18 and a drain of the second N-channel MOS transistor. The source of the second N-channel MOS transistor is connected to a first end of R12, and a gate of the second N-channel MOS transistor is connected to the second end of R12.

For ease of understanding, the following provides an example of the second over-energy absorption circuit 202 provided in Embodiment 6.

Figure 8:
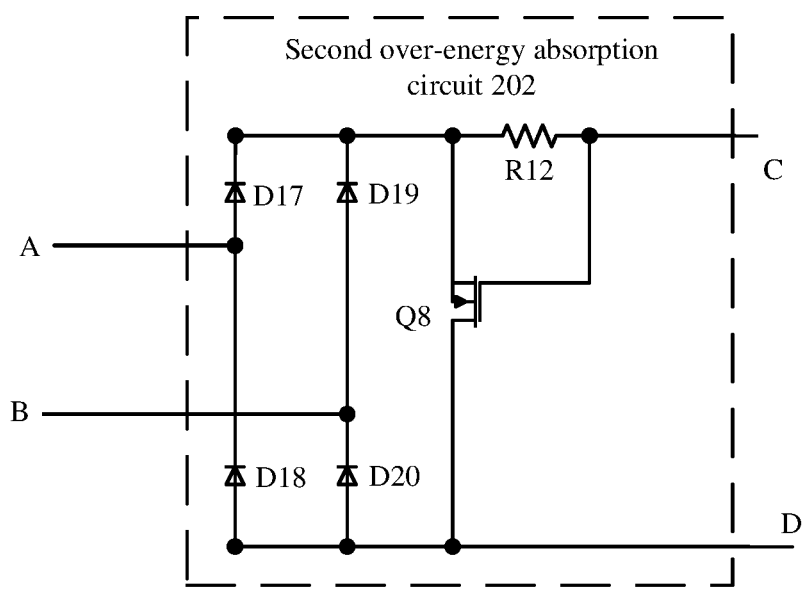
FIG. 8 is schematic diagram 6 of a structure of a second over-energy absorption circuit according to an embodiment.

FIG. 8 is a schematic diagram of a structure of the second over-energy absorption circuit 202 according to Embodiment 6. The circuit shown in FIG. 8 includes the resistor R12, the diodes D17, D18, D19, and D20, and a second N-channel MOS transistor (Q8). A and B serve as input ends of the second over-energy absorption circuit 202 and are respectively connected to the first terminal and the second terminal of the first over-energy absorption circuit 201. C and D serve as output ends of the second over-energy absorption circuit 202 and are connected to the residual current determining circuit 203.

When the second over-energy absorption circuit 202 shown in FIG. 8 absorbs over energy, A and B serve as single-phase alternating current input ends to receive a single-phase alternating current voltage output by the first over-energy absorption circuit 201, and C and D serve as single-phase direct current output ends to output the signal to the residual current determining circuit 203. The energy is transmitted from left to right.

When a major part (a part whose voltage value is greater than or equal to the first preset threshold at the initial over-energy stage) of the over energy is consumed by the first over-energy absorption circuit 202, for the residual energy (a voltage value is less than the first preset threshold) of the over energy, if a value of a current output after the residual energy passes through the first over-energy absorption circuit 201 is greater than or equal to the second preset threshold, when the signal passes through the resistor R12, a voltage drop generated at both ends of the resistor R12 is greater than a turn-on voltage of Q8 (that is, a product of the second preset threshold and the resistor R12 is greater than or equal to the turn-on voltage of Q8). Q8 is conducted. In this case, most of the residual energy is consumed through a path formed by Q8, and a current output to the residual current determining circuit 203 is almost zero. Therefore, the release does not act, thereby reducing impact of the over energy on the protection circuit.

3. Residual Current Determining Circuit 203

The residual current determining circuit 203 includes a detector and a drive circuit. A function of disposing the detector is to: when a value of the current flowing to the residual current control circuit is greater than or equal to a third preset threshold, send a drive signal to the drive circuit. A function of disposing the drive circuit is to: when receiving the drive signal, amplify power of the drive signal to generate a control signal, and send the control signal to the release, so as to control the release to be disconnected.

The detector is connected to the second over-energy absorption circuit 202, and the drive circuit is connected to the detector and the release.

The following describes a structure of the detector.

The detector includes a comparator and a third capacitor. A first end of the third capacitor is connected to the first terminal of the output end of the second over-energy absorption circuit, and a second end of the third capacitor is connected to the second terminal of the output end of the second over-energy absorption circuit. A first input end of the comparator is connected to the first end of the third capacitor, a second input end of the comparator is connected to a reference power supply, and an output end of the comparator is connected to the drive circuit.

The following describes a structure of the drive circuit.

The drive circuit includes: R14, R15, R16, R17, D21, a second capacitor, and a third NPN triode. A first end of R14 is connected to an anode of D21 and a first output terminal of the detector, and a second end of R14 is connected to a second output terminal of the detector and a second end of R15. A cathode of D21 is connected to the second end of R15 and a second end of R16. The second end of R16 is connected to a first end of the second capacitor and a first end of R17. An emitter of the third NPN triode is connected to a coil of the release, a base of the third NPN triode is connected to a second end of R17, and the emitter of the third NPN triode is connected to a second end of the second capacitor.

For ease of understanding, the following provides an example of the residual current determining circuit 203.

Figure 9:
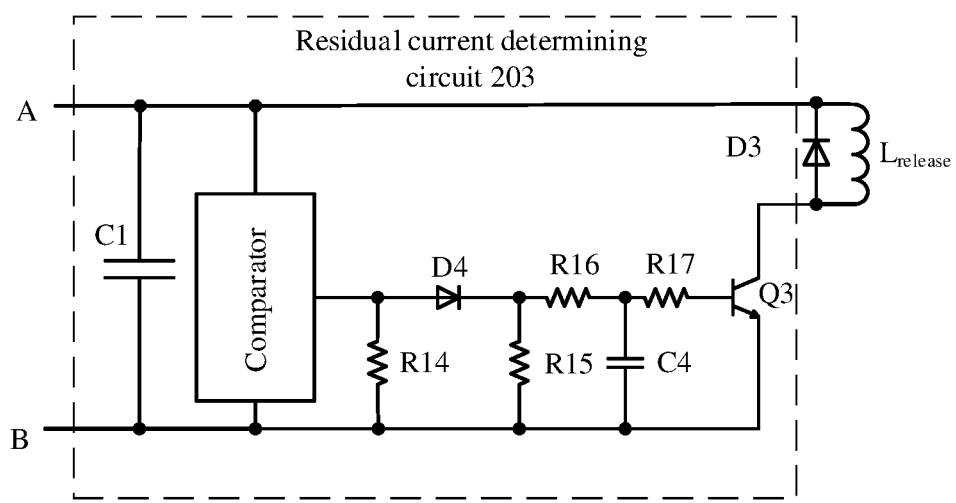
FIG. 9 is a schematic diagram of a structure of a residual current determining circuit according to an embodiment.
Figure 10:
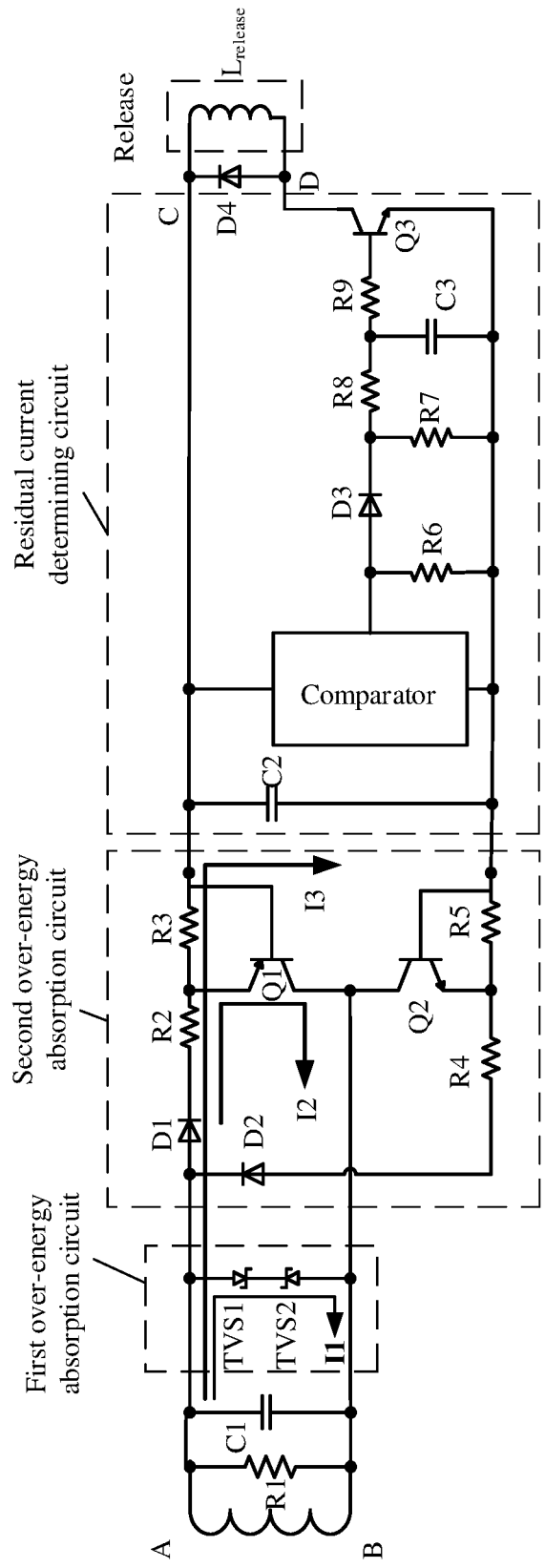
FIG. 10 is a schematic diagram of a circuit structure of an over-energy protection circuit according to an embodiment.

FIG. 9 is a schematic diagram of a structure of the residual current determining circuit 203 according to an embodiment. In FIG. 10, the residual current determining circuit 203 includes the comparator K, the resistors R14, R15, R16, and R17, the diode D21, the capacitors C1 and C2, and Q9. A and B serve as input ends of the residual current determining circuit 203 and are respectively connected to the two terminals of the output end of the second over-energy absorption circuit 202, and C and D serve as output ends of the residual current determining circuit 203 and are respectively connected to two terminals of the coil of the release.

When the residual current determining circuit 203 shown in FIG. 9 is used to control connection of the power supply path, A and B serve as direct current input ends to receive a direct current output by the second over-energy absorption circuit 202, and C and D serve as direct current output ends to output the drive signal to the coil of the release, so as to control the release to be energized or de-energized, and further control a main contact of the release to be open or closed, so that the power supply path is opened or closed.

When the detected value of the current output by the second over-energy absorption circuit 202 is greater than the third preset threshold, the current value charges the capacitor C1. When a value of a voltage at both ends of C1 is greater than a voltage of the reference power supply, the comparator K outputs a high-voltage signal. Power of the high-voltage signal is amplified by using R14, R15, R16, R17, and D21, and this signal is used to drive Q9 to close. At this time, the coil of the release is energized, and the main contact (a normally-closed switch) of the release is open. In this case, the power supply path is disconnected, to avoid damage caused by over energy to a load and a subsequent device, thereby implementing safety protection on the load and the system device.

With reference to the foregoing description, for example, a structure of an over-energy protection circuit provided in an embodiment may be shown in FIG. 10.

In a voltage regulator circuit, a converter circuit includes a resistor R1 and a capacitor C1. A primary side of a current transformer is connected to a power supply path (not shown), a first terminal of a secondary side of the current transformer is connected to a first end of R1 and a first end of C1, and a second terminal of the secondary side of the current transformer is connected to a second end of R1 and a second end of C2.

A first over-energy absorption circuit includes transient suppression diodes TVS1 and TVS2. An anode of TVS1 is connected to the first end of C1, a cathode of TVS1 is connected to a cathode of TVS2, and an anode of TVS2 is connected to the second end of C2.

A second over-energy absorption circuit includes resistors R2, R3, R4, and R5, diodes D1 and D2, a first PNP triode Q1, and a first NPN triode Q2. An anode of D1 is connected to the anode of TVS1 and a cathode of D2, and a cathode of D1 is connected to a first end of R2. A second end of the resistor R2 is connected to a first end of R3 and an emitter of Q1. A second end of R3 is connected to a first end of C2 and a base of Q1, and a collector of Q1 is connected to a collector of Q2 and the anode of TVS2. A base of Q2 is connected to a second end of R5, an emitter of Q2 is connected to a first end of R5 and a second end of R4, and a first end of R4 is connected to an anode of D2.

A residual current determining circuit includes a comparator K, resistors R6, R7, R8, and R9, a diode D3, the capacitors C2 and C3, and a second NPN triode Q3. The first end of C2 is connected to the first end of R2 and a first input end of K. A second end of C2 is connected to the second end of R5. A second input end of K is connected to a reference power supply. A first terminal of an output end of K is connected to a first end of R6. A second terminal of the output end of K is connected to a second end of R6. A cathode of D3 is connected to a second end of R7 and a second end of R8. A second end of R8 is connected to a first end of C4 and a first end of R9. An emitter of Q3 is connected to a coil of the release. A base of Q3 is connected to a second end of R9. The emitter of Q3 is connected to a second end of C4.

An input end of the over-energy protection circuit may be connected to the secondary side of the current transformer, and an output end of the over-energy protection circuit may be connected to the coil of the release.

When the protection circuit shown in FIG. 10 is configured to protect system safety, A and B serve as input ends of the protection circuit, and are connected to the secondary side of the current transformer (from which a single-phase alternating current is output), and C and D serve as output ends of the protection circuit, and are respectively connected to two ends of the coil of the release.

The secondary side of the current transformer is connected to the first over-energy absorption circuit, the first over-energy absorption circuit is connected to the second over-energy absorption circuit, the second over-energy absorption circuit is connected to the residual current determining circuit, and the residual current determining circuit is connected to the release. A main contact of the release is connected to the power supply path. A and B serve as the input ends of the protection circuit and are configured to receive the single-phase alternating current. For example, the system experiences a lightning strike. When the system experiences the lightning strike, a current occurring on a branch to be detected may be divided into two stages: an initial stage and a later stage. At the initial stage, lightning energy is relatively large, and a relatively large current is generated on the power supply path. In this case, a voltage value of a first signal output from the secondary side of the current transformer is relatively large and reaches a turn-on voltage (a first preset threshold) of TVS1 or TVS2. In an example of a positive half cycle of the first signal, when the voltage value of the first signal is greater than the turn-on voltage of TVS2, TVS2 is conducted. In this case, TVS1 and TVS2 form a conduction path I1 jointly with the secondary side of the current transformer, and over energy at the initial stage is consumed through the path. In this case, a current can hardly be output to the second over-energy absorption circuit, and the comparator K cannot be turned on. For the later stage (residual energy of the over energy), the over energy is reduced, and therefore the voltage value of the first signal output from the secondary side of the current transformer becomes less than the turn-on voltage of TVS1 and TVS2. The first over-energy absorption circuit does not operate, and the residual energy is directly output to the second over-energy absorption circuit. However, a current value of the signal is far greater than a current value of a signal output from the secondary side of the second transformer in case of a system fault (such as an electric leakage fault). In an example of the positive half cycle of the signal, when the signal passes through the resistor R3, a voltage drop generated at both ends of R3 is greater than a turn-on voltage of Q1 (a product of a second preset threshold and R3 is greater than or equal to the second preset threshold). Q1 is conducted. In this case, the residual energy is consumed through a path I2 formed by Q1 and the secondary side of the current transformer. The residual energy cannot reach the capacitor C2, or only a very small part of the residual energy can reach C2, and K cannot be turned on. Therefore, it can be understood that, when over energy occurs due to a lightning strike or a similar case against the system, the protection circuit is not affected.

It should be understood that, if no lightning arrester is configured in the system, the over-energy protection circuit provided in this embodiment may serve as a lightning arrester, to absorb lightning energy and avoid device damage caused by the lightning energy.

In case of a fault (such as an electric leakage) in the circuit, when the voltage value of the signal output from the secondary side of the current transformer is less than the first preset threshold and the current value thereof is less than the second preset threshold, using the positive half cycle of the signal as an example, none of TVS1, TVS2, and Q1 operates. The signal may directly reach both ends of C2 through a path I3 formed by D1, R2, and R3, to charge C2. In this case, if a voltage at both ends of C2 is greater than a third preset threshold (the voltage is greater than a voltage used for normal operation of the power supply path), when it is determined that a fault occurs in the system, K sends a drive signal to drive Q3 to be conducted, and the release is energized to disconnect the power supply path. This implements safety protection on a load and a system device.

It should be noted that, according to the different structures of the second over-energy absorption circuit provided in the foregoing embodiments, the over-energy protection circuit provided in this embodiment further has several other structures, and principles of the other circuit structures are the same. Details are not elaborated.

Figure 11:
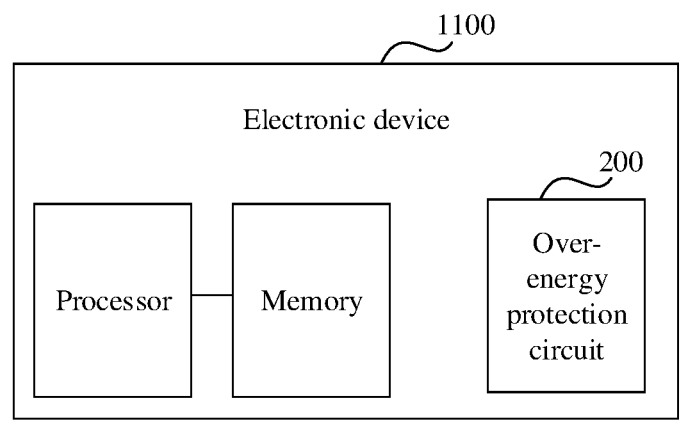
FIG. 11 is a schematic diagram of a structure of an electronic device according to an embodiment.

Based on a same concept, the embodiments may further provide an electronic device. Referring to FIG. 11, the electronic device 1100 includes the foregoing over-energy protection circuit 200. The electronic device 1100 may be a communications device such as a base station. In addition to the over-energy protection circuit 200, the electronic device 1100 includes a processor and a memory. The processor is configured to read code stored in the memory to perform various data processing.

Optionally, the electronic device 1100 may further include a power supply circuit (to implement various power conversion) and a powered device. The alternating current power supply is configured to supply power to the powered device and the over-energy protection circuit 200.

The electronic device 1100 may be connected to a power supply system. The electronic device 1100 is configured to protect the power supply system when a fault occurs in the power supply system.

The electronic device 1100 may be connected to a power distribution system. The electronic device 1100 is configured to protect the power distribution system when a fault occurs in the power distribution system.

The fault may be an electric leakage fault, an overload fault, or a short circuit fault.

Figure 12:
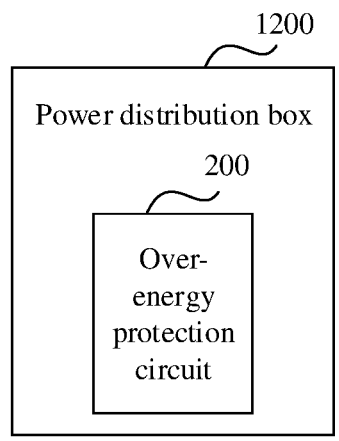
FIG. 12 is a schematic diagram of a structure of a power distribution box according to an embodiment.

As shown in FIG. 12, a power distribution box 1200 includes the over-energy protection circuit 200.

The foregoing descriptions are merely implementations, but are not intended to limit the scope of the embodiments. Any variation or replacement readily figured out by a person skilled in the art shall be within to the scope of the embodiments.

What is claimed is:

1. An over-energy protection circuit, applied to a residual current device, wherein the residual current device comprises:
   the over-energy protection circuit,
   a current transformer, and
   a release;
   the over-energy protection circuit comprises:
      a first over-energy absorption circuit,
      a second over-energy absorption circuit, and
      a residual current determining circuit; the first over-energy absorption circuit is connected to a secondary side of the current transformer, and is configured to:
      receive a first electrical signal output from the secondary side of the current transformer; and when a voltage value of the first electrical signal is greater than or equal to a first preset threshold,
      perform step-down processing on the voltage value of the first electrical signal to obtain a second electrical signal, and
      output the second electrical signal to the second over-energy absorption circuit; or
      when a voltage value of the first electrical signal is less than the first preset threshold, output the first electrical signal to the second over-energy absorption circuit; the second over-energy absorption circuit is connected to an output end of the first over-energy absorption circuit, and is configured to:
      when an input current input to the second over-energy absorption circuit is greater than or equal to a second preset threshold, absorb energy of the input current; or
      when a current input to the second over-energy absorption circuit is less than the second preset threshold, output the input current to the residual current determining circuit; and the residual current determining circuit is connected to an output end of the second over-energy absorption circuit and the release and is configured to when the current flowing to the residual current control circuit meets a predetermined condition, control the release to be disconnected.

2. The over-energy protection circuit according to claim 1, wherein the second over-energy absorption circuit further comprises:
   R1, R2, R3, R4, first diodes D1 and D2, a first PNP triode, and a first NPN triode, an anode of D1 is a first terminal of an input end of the second over-energy absorption circuit, a collector of the first PNP triode is a second terminal of the input end of the second over-energy absorption circuit, a first end of R2 is a first terminal of the output end of the second over-energy absorption circuit, and a second end of R4 is a second terminal of the output end of the second over-energy absorption circuit, the anode of D1 is connected to a first terminal of the output end of the first over-energy absorption circuit and a cathode of D2, and a cathode of D1 is connected to a first end of R1, a second end of the first R1 is connected to the first end of R2 and an emitter of the first PNP triode, a second end of R2 is connected to a base of the first PNP triode, the collector of the first PNP triode is connected to a collector of the first NPN triode and a second terminal of the output end of the first over-energy absorption circuit, an anode of D2 is connected to a first end of R3, and an emitter of the first NPN triode is connected to the first end of R3 and a first end of R4, and a base of the first NPN triode is connected to the second end of R4.

3. The over-energy protection circuit according to claim 1, wherein the second over-energy absorption circuit further comprises:
   R5, R6, D3, D4, a first P-channel metal oxide semiconductor MOS transistor, and a first N-channel MOS transistor, an anode of D3 is a first terminal of an input end of the second over-energy absorption circuit, a drain of the first N-channel MOS transistor is a second terminal of the input end of the second over-energy absorption circuit, a second end of R5 is a first terminal of the output end of the second over-energy absorption circuit, and a second end of R6 is a second terminal of the output end of the second over-energy absorption circuit; the anode of D3 is connected to a first terminal of the output end of the first over-energy absorption circuit and a cathode of D4, and a cathode of D3 is connected to a first end of R5 and a source of the first N-channel MOS transistor, the second end of R5 is connected to a gate of the first N-channel MOS transistor; a drain of the first P-channel MOS transistor is connected to the drain of the first N-channel MOS transistor and a second terminal of the output end of the first over-energy absorption circuit, a source of the first P-channel MOS transistor is connected to a first end of R6, and a gate of the first P-channel MOS transistor is connected to the second end of R6, and the first end of R6 is connected to an anode of D4.

4. The over-energy protection circuit according to claim 1, wherein the second over-energy absorption circuit further comprises:
   R7, R8, D5, D6, D7, D8, and a second PNP triode; an anode of D5 is a first terminal of an input end of the second over-energy absorption circuit, a cathode of D8 is a second terminal of the input end of the second over-energy absorption circuit, a second end of R8 is a first terminal of the output end of the second over-energy absorption circuit, and an anode of D8 is a second terminal of the output end of the second over-energy absorption circuit, the anode of D5 is connected to a first terminal of the output end of the first over-energy absorption circuit and a cathode of D6, and a cathode of D5 is connected to a cathode of D7 and a first end of R7, the cathode of D8 is connected to an anode of D7 and a second terminal of the output end of the first over-energy absorption circuit, and the anode of D8 is connected to an anode of D6 and a collector of the second PNP crystal triode, a second end of R7 is connected to an emitter of the second PNP triode and a first end of R8, and the second end of R8 is connected to a base of the second PNP triode.

5. The over-energy protection circuit according to claim 1, wherein the second over-energy absorption circuit further comprises:
   R9, R10, D9, D10, D11, D12, and a second NPN triode, an anode of D9 is a first terminal of an input end of the second over-energy absorption circuit, a cathode of D12 is a second terminal of the input end of the second over-energy absorption circuit, a cathode of D11 is a first terminal of the output end of the second over-energy absorption circuit, and a second end of R10 is a second terminal of the output end of the second over-energy absorption circuit, the anode of D9 is connected to a first terminal of the output end of the first over-energy absorption circuit and a cathode of D10, and a cathode of D9 is connected to the cathode of D11 and a collector of the second NPN triode, the cathode of D12 is connected to an anode of D11 and a second terminal of the output end of the first over-energy absorption circuit, and an anode of D12 is connected to an anode of D10 and a first end of R9, a second end of R9 is connected to a first end of R10 and an emitter of the second NPN triode, and the second end of R10 is connected to a base of the second NPN triode.

6. The over-energy protection circuit according to claim 1, wherein the second over-energy absorption circuit further comprises:
R11, D13, D14, D15, D16, and a second P-channel MOS transistor, an anode of D13 is a first terminal of an input end of the second over-energy absorption circuit, a cathode of D16 is a second terminal of the input end of the second over-energy absorption circuit, a cathode of D15 is a first terminal of the output end of the second over-energy absorption circuit, and a second end of R11 is a second terminal of the output end of the second over-energy absorption circuit, the anode of D13 is connected to a first terminal of the output end of the first over-energy absorption circuit and a cathode of D14, and a cathode of D13 is connected to a drain of the second P-channel MOS transistor, the cathode of D16 is connected to an anode of D15 and a second terminal of the output end of the first over-energy absorption circuit, and an anode of D16 is connected to an anode of D14 and a source of the second P-channel MOS transistor, and the source of the second P-channel MOS transistor is connected to a first end of R11, and a gate of the second P-channel MOS transistor is connected to the second end of R11.

7. The over-energy protection circuit according to claim 1, wherein the second over-energy absorption circuit further comprises:
R12, D17, D18, D19, D20, and a second N-channel MOS transistor, an anode of D17 is a first terminal of an input end of the second over-energy absorption circuit, a cathode of D20 is a second terminal of the input end of the second over-energy absorption circuit, a second end of R12 is a first terminal of the output end of the second over-energy absorption circuit, and an anode of D20 is a second terminal of the output end of the second over-energy absorption circuit, the anode of D17 is connected to a first terminal of the output end of the first over-energy absorption circuit and a cathode of D18, and a cathode of D17 is connected to a cathode of D19 and a source of the second N-channel MOS transistor, the cathode of D20 is connected to a second terminal of the output end of the first over-energy absorption circuit and an anode of D19, and the anode of D20 is separately connected to an anode of D18 and a drain of the second N-channel MOS transistor, and the source of the second N-channel MOS transistor is connected to a first end of R12, and a gate of the second N-channel MOS transistor is connected to the second end of R12.

8. The over-energy protection circuit according to claim 1, wherein the first over-energy absorption circuit further comprises:
at least two transient suppression diodes, and the at least two transient suppression diodes are configured to:
when the voltage value of the first electrical signal is greater than or equal to the first preset threshold, perform step-down processing on the voltage value of the first electrical signal to obtain the second electrical signal, and output the second electrical signal to the second over-energy absorption circuit; or
when the voltage value of the first electrical signal is less than the first preset threshold, output the first electrical signal to the second over-energy absorption circuit.

9. The over-energy protection circuit according to claim 1, further comprising:
a voltage regulator circuit, wherein the voltage regulator circuit is connected between the secondary side of the current transformer and the first over-energy absorption circuit, and is configured to regulate the voltage value and a current value of the first electrical signal; the voltage regulator circuit comprises: R13 and a first capacitor, a first end of R13 is connected to a first terminal of the secondary side of the current transformer, and a second end of R13 is connected to a second terminal of the secondary side of the current transformer, and a first end of the first capacitor is connected to the first end of R13, and a second end of the first capacitor is connected to the second end of R13.

10. The over-energy protection circuit according to claim 2, wherein the residual current determining circuit further comprises:
a detector, wherein the detector is connected to the output end of the second over-energy absorption circuit, and the detector is configured to:
when a value of the current flowing to the residual current control circuit is greater than or equal to a third preset threshold, send a drive signal to a drive circuit; and the drive circuit, wherein the drive circuit is connected to the detector, and the drive circuit is configured to:
when receiving the drive signal, amplify power of the drive signal to generate a control signal, and send the control signal to the release, so as to control the release to be disconnected.

11. The over-energy protection circuit according to claim 10, wherein the drive circuit further comprises:
R14, R15, R16, R17, D21, a second capacitor, and a third NPN triode, a first end of R14 is connected to an anode of D21 and a first output terminal of the detector, and a second end of R14 is connected to a second output terminal of the detector and a second end of R15, a cathode of D21 is connected to the second end of R15 and a second end of R16, the second end of R16 is connected to a first end of the second capacitor and a first end of R17, and an emitter of the third NPN triode is connected to a coil of the release, a base of the third NPN triode is connected to a second end of R17, and the emitter of the third NPN triode is connected to a second end of the second capacitor.

12. The over-energy protection circuit according to claim 10, wherein the detector further comprises:
a comparator; and
a third capacitor, a first end of the third capacitor is connected to the first terminal of the output end of the second over-energy absorption circuit, and a second end of the third capacitor is connected to the second terminal of the output end of the second over-energy absorption circuit, and a first input end of the comparator is connected to the first end of the third capacitor, a second input end of the comparator is connected to a reference power supply, and an output end of the comparator is connected to the drive circuit.

13. A residual current device, comprising the over-energy protection circuit according to claim 1.

14. An electronic device, comprising the over-energy protection circuit according to claim 1, a processor, and a memory, wherein the processor is configured to read code stored in the memory to perform data processing.

15. A power distribution box, comprising the over-energy protection circuit according to claim 1.

* * * * *